United States Patent [19]

Sprott et al.

[11] 3,952,246
[45] Apr. 20, 1976

[54] PLASMA DIGITAL DENSITY DETERMINING DEVICE

[75] Inventors: Julien C. Sprott; Thomas W. Lovell; Donald J. Holly, all of Madison, Wis.

[73] Assignee: The United States of America as represented by the United States Energy Research and Development Administration, Washington, D.C.

[22] Filed: May 29, 1975

[21] Appl. No.: 581,606

[52] U.S. Cl. .................... 324/58.5 C; 324/58.5 A
[51] Int. Cl.[2] ................................. G01R 27/04
[58] Field of Search .................. 324/58.5 A, 58.5 C, 324/58.5 R, 58 C

[56] References Cited
UNITED STATES PATENTS

| | | | |
|---|---|---|---|
| 2,457,673 | 12/1948 | Hershberger | 324/58.5 C |
| 3,265,967 | 8/1966 | Heald | 324/58.5 A |
| 3,473,116 | 10/1969 | Grantham | 324/58.5 A |
| 3,599,089 | 8/1971 | Bugnold | 324/58.5 A |
| 3,691,454 | 9/1972 | Hrubesh et al. | 324/58.5 C X |

Primary Examiner—Stanley T. Krawczewicz
Attorney, Agent, or Firm—Dean E. Carlson; Arthur A. Churm; Donald P. Reynolds

[57] ABSTRACT

The density of a decaying plasma in an electrically conducting enclosure is determined by applying an excitation to the cavity formed by the enclosure and counting digitally the number of resonant frequencies traversed by the combination of the cavity and the decaying plasma.

5 Claims, 4 Drawing Figures

PLASMA DIGITAL DENSITY DETERMINING DEVICE

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

One of the most important properties of a plasma is its density. While this density is in general a point function, it is often adequate to obtain a measure of the density by measuring the average plasma density over a volume. This information is useful where the plasma is uniform in density over the volume or where the density profile over the volume is known by other means. Reliable measurements also require that the method used to measure density not perturb the density in the course of measurement. This is especially critical in determining the properties of low-density plasmas which are taken to be plasmas less than $10^{13}$ particles per cubic centimeter or $10^{19}$ particles per cubic meter. Plasmas in this density range are conveniently measured by several well-known microwave techniques. These include the fundamental-mode method and the microwave interferometer. In the fundamental-mode method a known cavity shape, a known microwave excitation frequency and a knowledge of the density profile of the plasma in the cavity are combined to determine plasma density from the shift of the resonant frequency of the fundamental mode. This method requires precise determination of the frequency shift. The microwave interferometer measures the average value of density by measuring the change in transmission properties along a line of propagation of a measuring microwave field, but has the disadvantage of requiring high precision of frequency stability and good collimation of the microwave beam to avoid exciting cavity resonances that would interfere with the measurement.

It is an object of the present invention to provide a better means of measuring the density of a plasma.

It is a further object of the present invention to provide a means of measuring plasma density without perturbing the plasma.

It is a further object of the present invention to provide a means of measuring the density of a plasma without regard to the shape of the enclosure in which the plasma is contained.

It is a further object of the present invention to provide a means of measuring the density of a plasma with a frequency source of ordinary frequency stability.

Other objects will become apparent in the course of a detailed description of the invention.

SUMMARY OF THE INVENTION

The average density of a decaying plasma in a microwave cavity large enough to support several resonant modes is determined by filling the cavity with microwave radiation and counting digitally the modes excited to resonance by the microwave radiation as the plasma is permitted to decay.

DESCRIPTION OF THE PREFERRED EMBODIMENT

Figure 1:
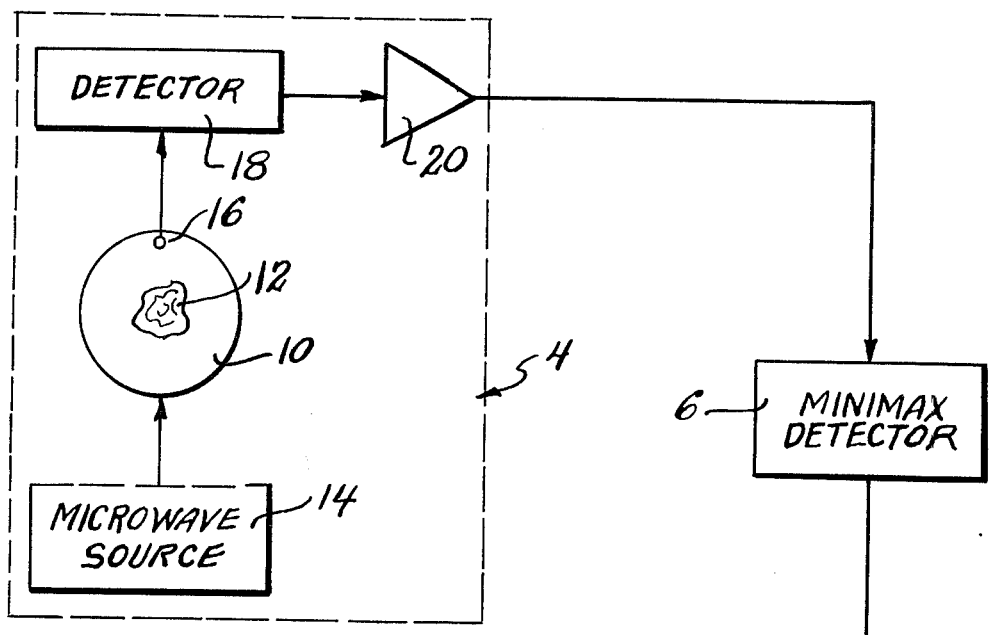
FIGS. 1 and 2 are an overall block diagram of the apparatus of the present invention.
Figure 1:
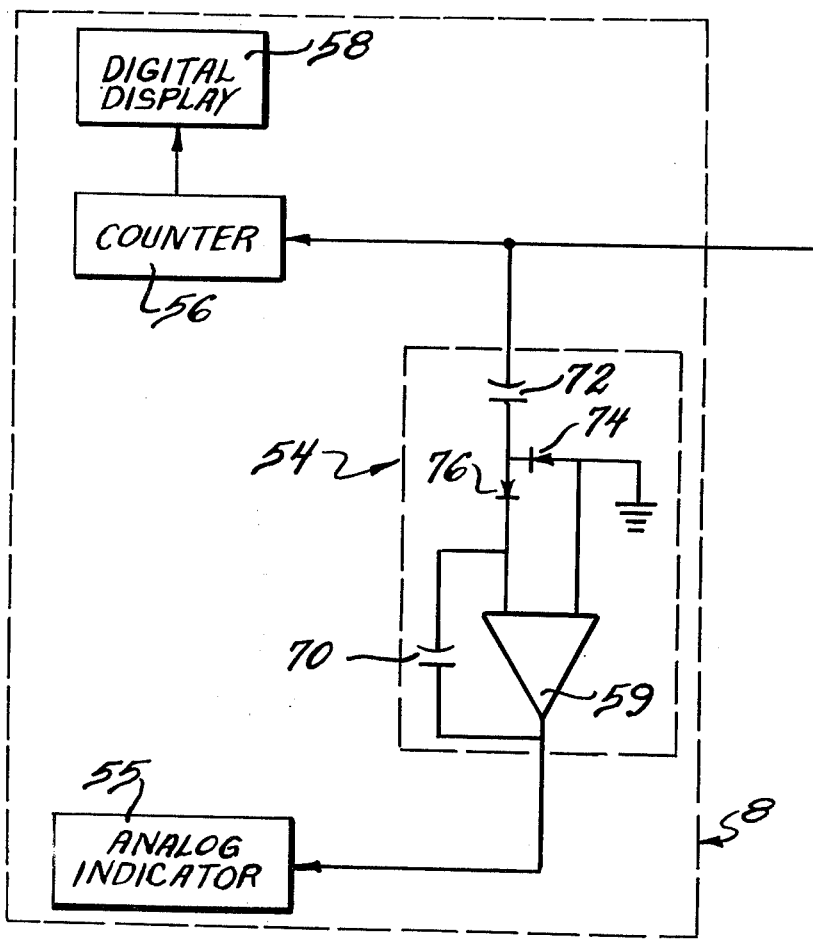
Figure 2:
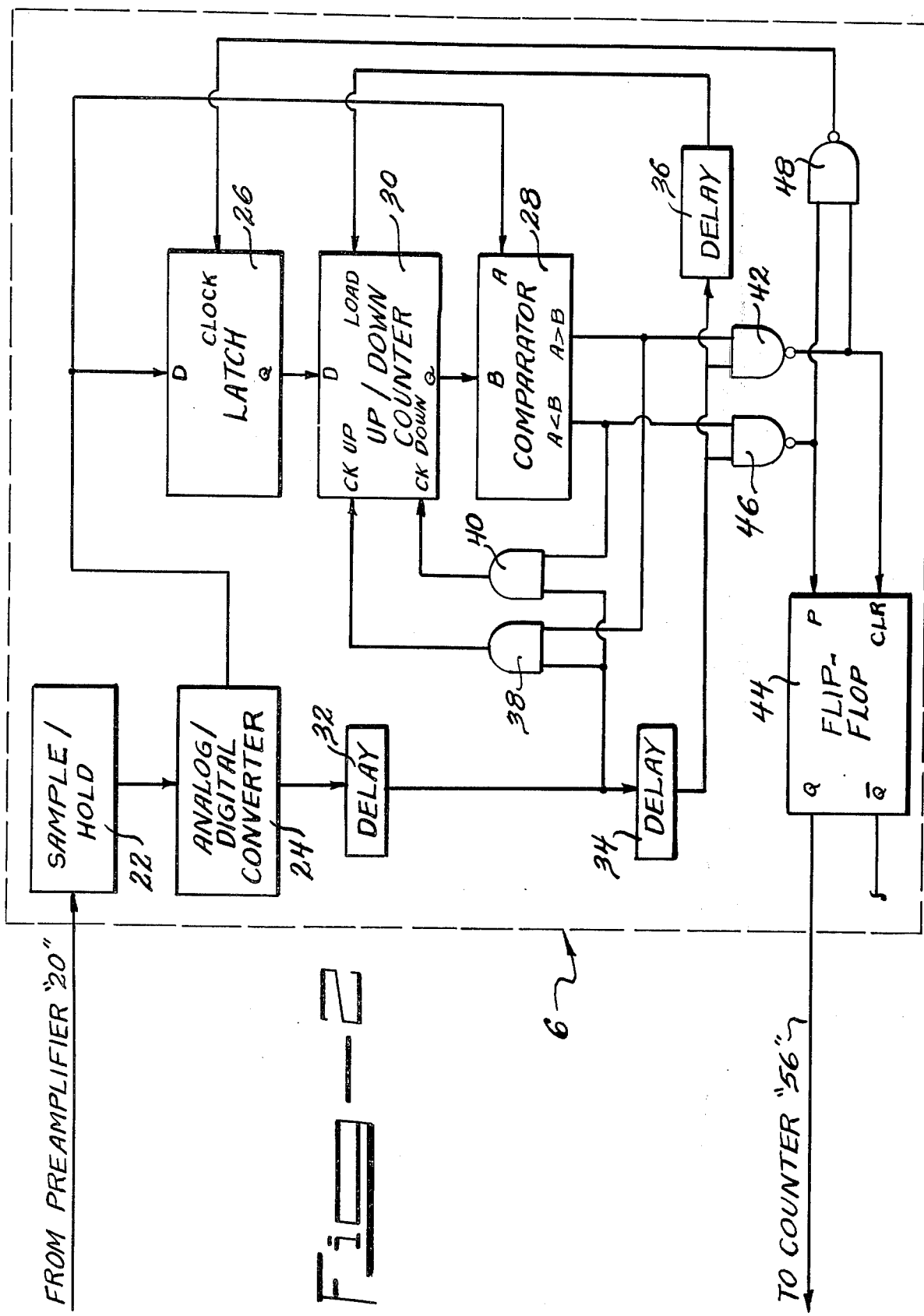

FIGS. 1 and 2 together comprise an overall block diagram of an apparatus for the practice of the present invention. In FIG. 1 mode generator 4 generates a number of resonant responses as the plasma within it decays and the resultant changes in the plasma resonant frequency couple to various cavity modes. Digital minimax detector 6 is connected to mode generator 4 to detect the number of minima or maxima in the response and thus the detected number of modes traversed. Display 8 makes the number of detected modes visible to an observer who can determine plasma density therefrom. Mode generator 4 comprises cavity 10, plasma 12, microwave source 14, receiving antenna 16, detector 18, and preamplifier 20. Cavity 10 is entirely or partly filled with plasma 12, the density of which is to be measured. Microwave source 14 is connected electrically to cavity 10 to couple thereto electromagnetic energy at a conveniently chosen microwave frequency. The microwave energy from microwave source 14 is caused to propagate in and resonate within cavity 10 and is received by receiving antenna 16. As will be seen, the properties of plasma 12 affect the resonant properties of cavity 10 and hence the propagation of the microwave energy from microwave source 14 to receiving antenna 16 in a way that provides a measure of the properties of the plasma. Detector 18, typically a microwave diode, responds to the amplitude of the microwave signal received by receiving antenna 16. The output of detector 18 is coupled to preamplifier 20, typically a low-noise preamplifier, and the amplified signal from preamplifier 20 is coupled to minimax detector 6. The signal leaving amplifier 20 is an analog signal that is applied to sample-and-hold unit 22, the purpose of which is to select the present level of the output signal from preamplifier 20 and hold that level for a period long enough to permit analog-to-digital conversion of the output of sample-and-hold unit 22. This is accomplished in digital minimax detector 6, shown in detail in FIG. 2, which comprises the following electronic units. Sample-and-hold unit 22 has already been described. Analog-to-digital converter 24 receives the output of sample-and-hold unit 22 and generates therefrom two output signals, an end-of-conversion (EOC) signal and a digital equivalent signal. The digital equivalent signal is applied to a latch 26 and as a first comparison input to a digital comparator 28. At the end of each comparison the output of the latch 26 is loaded into up-down counter 30 under the control of a delayed EOC signal from analog-to-digital converter 24. The EOC signal is thrice delayed, through first time delay 32, second time delay 34, and third time delay 36, then coupled through a connection to the load terminal of up-down counter 30. Digital comparator 28 receives as a second comparison input the output of up-down counter 30 and compares that output with the first comparison input from analog-to-digital converter 24. If the present value of the digital equivalent signal, the first comparison input, is greater than the value stored in up-down counter 30, the second comparison input, then up-down counter 30 is counted up one count. This is accomplished by gating the greater-than output of digital comparator 28 and a once delayed EOC signal, the output of first time delay 32, through first AND gate 38 to up-down counter 30. If the present value of the digital equivalent signal is less than the value stored in up-down counter 30, then up-down counter 30 is counted down one count. This is accomplished by gating the less-than output of digital comparator 28 and the output of first time delay 32 through second AND gate 40 to up-down counter 30.

The present value of the digital equivalent signal from analog-to-digital converter 24 is next compared in comparator 28 to the present value of the output of up-down counter 30. If the present value of the digital equivalent signal is greater than the output of up-down counter 30, a signal is supplied to first NAND gate 42, which also receives as an input a twice-delayed EOC signal from second time delay 34. The output of first NAND gate 42 is connected to the clear input to flip-flop 44, to clear flip-flop 44 when the present value of the digital equivalent signal is greater than the output of up-down counter 30. If the present value of the digital equivalent signal is less than the output of up-down counter 30, a signal is supplied to second NAND gate 46, which also receives as an input the twice-delayed EOC signal from second time delay 34. The output of second NAND gate 46 is connected to the preset input of flip-flop 44. The outputs of NAND gates 42 and 46 are also connected as inputs to third NAND gate 48, so that if either the preset or the clear input of flip-flop 44 receives a signal, latch 26 receives an output signal as a clock input from third NAND gate 48. This causes latch 26 to be loaded with the present value of the digital equivalent signal from analog-to-digital converter 24. If neither input to flip-flop 44 receives a signal, latch 26 retains its present value without change. The up-down counter 30 is then caused by the thrice-delayed EOC signal from third time delay 36 to assume the signal of the present value of latch 26.

The result of the foregoing sequence of operations is that a digital equivalent signal indicating an increasing output of analog-to-digital converter 24 is coupled to flip-flop 44 only if the digital equivalent signal has increased by at least twice the value of the least significant bit of analog-to-digital converter 24. Similarly, a digital equivalent signal representing a decreasing output of analog-to-digital converter 24 is coupled to flip-flop 44 only if the digital equivalent signal has decreased by at least twice the value of the least significant bit. This reduces the sensitivity of the system to noise during intervals when the output of analog-to-digital converter 24 is essentially constant or varying very slowly. This completes the description of digital minimax detector 6.

The output of flip-flop 44 is coupled to display 8, comprising a charge pump 54 to provide an analog indication on analog indicator 55 of the number of peaks detected and also a counter 56 which receives the output of flip-flop 44 as an input and provides as an output a count of the number of peaks detected. This count is displayed on digital display 58, which completes display 8.

Operation of the circuit of FIGS. 1 and 2 is as follows: suppose the existence of a homogeneous collisionless plasma 12 in cavity 10. Suppose further that any applied excitation is at a frequency above the electron plasma radian frequency $ne^2/m\epsilon_o$. This plasma will affect the permittivity of the region it occupies in the cavity according to the following relation:

$$\epsilon = \epsilon_o - ne^2/m\omega^2$$

In these expressions, $\epsilon$ is the permittivity of the plasma, $\epsilon_o$ is the permittivity of free space, $n$ is the plasma density, $e$ is the electronic charge, $m$ is the electronic mass, and $\omega$ is the radian frequency of excitation. It can be seen from this expression that when the excitation frequency $\omega$ is fixed, the permittivity $\epsilon$ is a function of the plasma density n and hence that a means of detecting the change in permittivity as the plasma decays for a fixed frequency of excitation will provide a measure of the plasma density that existed when decay began. Furthermore, if cavity 10 is at all substantial in size, it will exhibit a number of resonant modes at any given frequency in the microwave region. This requires only a characteristic cavity dimension of least 3–4 freespace wavelengths of the exciting frequency. If cavity 10 is subject to a static magnetic field B, then the exciting angular frequency must be greater than the electron cyclotron angular frequency which is given by $(eB)/m$. As the permittivity varies with varying plasma density, the cavity will repeatedly become resonant and then depart from resonance at the given frequency of excitation. Referring to FIG. 1, the result for a microwave source 14 of fixed frequency and amplitude will be a variation in the amount of microwave signal received by receiving antenna 16. Some of the resonances through which the system passes in cavity 10 will produce relative peaks at detector 18, each of such peaks producing an increasing signal input to preamplifier 20 and hence at the output of sample-and-hold unit 22. In general, not all resonant modes will be observed under any given set of measuring conditions, but the detected peaks will include those modes that are coupled to the detector. The response of the individual components of minimax detector 6 has been described earlier. The effect of this response is to cause a change from low to high in the output of flip-flop 44 of FIG. 2 whenever there is a peak in the output signal from analog-to-digital converter 24. These peaks are counted both digitally and on an analog basis. Ditigal counting is effected in counter 56 which produces a count of the number of peaks through which the resonance has passed while plasma 12 decays and goes out. This count is displayed on digital display 58. Charge pump 54 is a conventional integrating circuit comprising an operational amplifier 59 with an integrating capacitor 70. The output of flip-flop 44 is brought to charge pump 54 through coupling capacitor 72 and is applied across diode 64. The signal is coupled to operational amplifier 59 through diode 76. The combination comprises an integrator on the positive-going output of flip-flop 44, producing an analog output for display on analog indicator 55 that is proportional to the number of output pulses from flip-flop 44.

Figure 3:
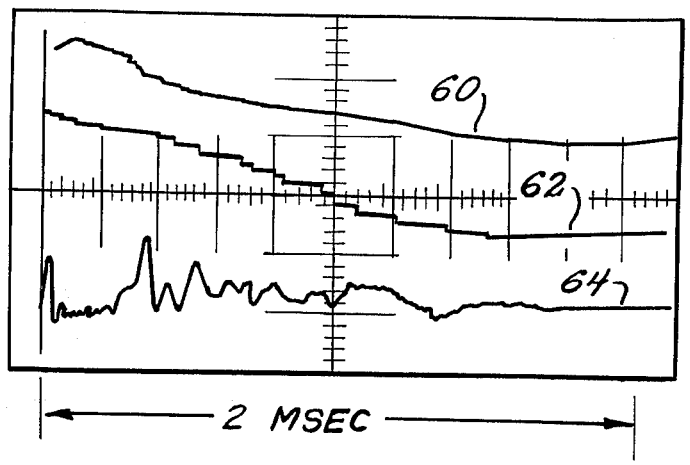
FIG. 3 is a copy of an oscillogram obtained in making measurements with the apparatus of FIGS. 1 and 2.

FIG. 3 is a reproduction of a photograph of a set of oscillogram traces illustrating the information obtained from the apparatus of FIGS. 1 and 2 during the decay of a plasma. In FIG. 3 curve 60 is the output of a Langmuir probe, which was obtained as a comparison reference over the approximately 2 milliseconds of decay shown in FIG. 3. Curve 62 is an oscillogram of the analog output obtained from the circuit of FIGS. 1 and 2 and curve 64 is a display of the mode changes through which the cavity passed as the plasma decayed, obtained at the output of preamplifier 20. The curves shown here were obtained in a toroidal cavity having aluminum walls and an internal volume of $3 \times 10^5$ cubic centimeters. The microwave source was a klystron delivering approximately 10 mW at 25 GHz. Electromagnetic energy was coupled through a hole in the cavity wall. A hole located at the opposite side of the toroid from the input hole coupled energy to a 1N26 microwave diode which served as a microwave detector. A plasma was produced in the toroid by electron cyclotron resonance heating using a high-power pulsed magnetron. The afterglow of this plasma was measured when the magnetron was turned off to produce the results shown in FIG. 3.

Figure 4:
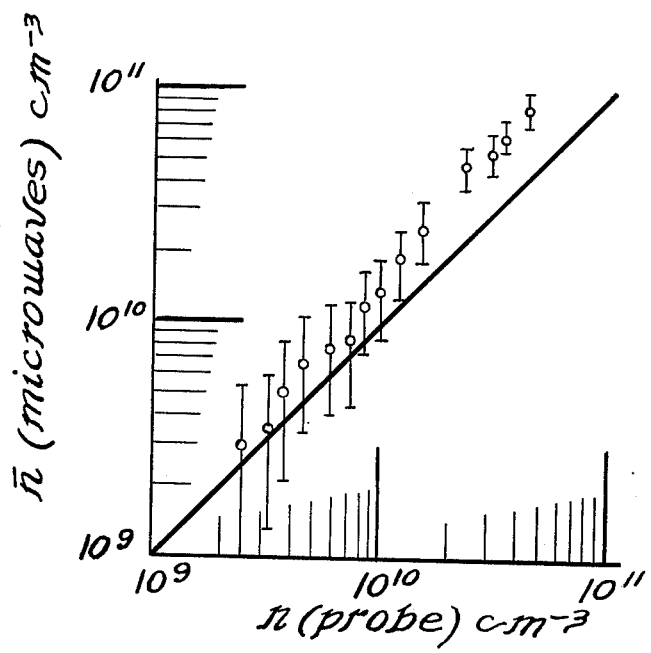
FIG. 4 is a comparison of results obtained with the apparatus of FIGS. 1 and 2 with those obtained by a Langmuir probe.

The system was compared with the results obtained from a Langmuir probe over a range of plasma densities comprising nearly two decades. These results are shown in FIG. 4, which is a log-log plot of the density obtained using the apparatus of FIGS. 1 and 2 as an abscissa and the density determined by a Langmuir probe as the ordinate. In FIG. 4 the values obtained for plasma density by use of a Langmuir probe are taken as correct and the uncertainty in measurement is indicated as the range of the vertical lines through each of the observed points. Values were obtained for plasma densities ranging from $3 \times 10^9$ particles per cubic centimeter to almost $1 \times 10^{11}$ particles per cubic centimeter. Over this observed range the agreement is seen to be within about a factor of 2.

The basis of both operation and calibration of the apparatus in FIGS. 1 and 2 is obtained from a perturbation of the expression for permittivity given above. This is obtained as follows. Since $n = m\omega^2 (\epsilon_o - \epsilon)/e^2$, and since to a first order of approximation the permittivity of the plasma is approximately equal to that of free space, it follows that the variation of the density $n$ is given by the following expression: Var $n = 2\epsilon_o\, m\omega/e^2$ Var $\omega$. This relates the variation in density to the variation in frequency and hence identifies the number of modes that will be detected by the detector as the plasma varies in density from an initial value to zero. The average mode spacing to be expected is determined by sweeping the frequency of the microwave source when applied to the cavity without a plasma therein. The density to be measured must be large enough to shift through many modes and yet small enough to permit the application of perturbation theory. This can be expressed in terms of measurable properties as follows:

$$1/Q << \omega_p^2/\omega^2 << 1$$

where $Q$ is the $Q$ of the unloaded cavity, $\omega$ is the exciting frequency, and $\omega_p$ is the plasma resonant frequency given by the expression $\omega_p^2 = ne^2/m\epsilon_o$. This expression and all those containing a quantity $\omega$ refer in the customary fashion to the radian frequency of the appropriate source or resonance. The criterion chosen in the application of the present apparatus to detecting mode changes was to assume that a mode exists if the detector response passes through a local maximum as a function of frequency during calibration or as a function of time during the decay of a plasma. The particular combination of equipment used was a conventional seven-bit successive-approximation analog-to-digital converter. The conversion time achieved was of the order of 350 nsec. Since it takes at least 3 points to detect a peak unambiguously, the narrowest peaks detected were of the order of 1 microsecond.

Calibration of the subject apparatus requires a microwave source of variable frequency in the range in which measurements are to be made and also a means of determining the frequency at a particular time. The modes are counted using the equipment of FIGS. 1 and 2 with no plasma 12 in cavity 10 and with a known variable frequency of microwave source 14. Reference to an observed tabulation of modes vs. frequency provides a method of developing a corresponding association of modes vs. density through the variational expression described above. Once the calibration is effected, the simpler single-frequency source is again used as microwave source 14.

It should be evident that the circuit of FIGS. 1 and 2 was arbitrarily set up to respond to peaks of the detected cavity modes and to generate positive signals therefrom. The circuit could equally as well be used to respond to local minima by reversing the output connections from NAND gates 42 and 46 to the clear and preset inputs of flip-flop 44 by connecting first NAND gate 42 to the preset input and second NAND gate 46 to the clear input to flip-flop 44. Positive-going signals can be obtained in either configuration by taking as an output the Q terminal of flip-flop 44. This would necessitate reversing the polarities of diodes 74 and 76. These are routine changes that would have no effect upon the principles of operation.

The embodiments of the invention in which an exclusive property or privilege is claimed are defined as follows:

1. A method of determining the spatially averaged density of a plasma in an enclosure comprising the steps of:
   a. generating an r-f signal at a known frequency;
   b. coupling the r-f signal into the enclosure at a first location;
   c. detecting the r-f signal at a second location distinct from the first location;
   d. permitting the plasma to decay to a neutral gas; and
   e. counting digitally the number of maxima of the detected r-f signal, which number of maxima equals the number of resonant cavity modes detected as being excited in the enclosure and hence provides a measure of the spatially averaged density of the plasma in the enclosure.

2. An apparatus for determining the density of a plasma in a microwave cavity comprising:
   a. a microwave source connected to the cavity to radiate microwave energy therein;
   b. a receiving antenna connected to the cavity and responsive to microwave energy therein;
   c. a detector connected to the antenna and responsive to electrical signals therein to detect the microwave energy and generate therefrom an output corresponding to the amplitude of said detected microwave energy;
   d. a preamplifier connected to said detector and responsive thereto to amplify the output of said detector to produce an amplified output;
   e. a minimax detector connected to said preamplifier and responsive thereto to produce an output proportional to the number of maxima in the amplified output from the preamplifier; and
   f. display means connected to the minimax detector and responsive thereto to display the number of maxima detected by the minimax detector, which number of maxima is a measure of the density of the plasma in the microwave cavity.

3. The apparatus of claim 2 wherein the minimax detector comprises:
   a. a sample-and-hold unit connected to the preamplifier and responsive thereto to generate an electrical signal that is a step approximation to the output of the preamplifier;
   b. an analog-to-digital converter connected to the sample-and-hold unit and generating therefrom a digital equivalent signal and an end-of-conversion (EOC) signal;
   c. a first delay unit connected to the analog-to-digital converter and receiving therefrom the end of conversion signal to generate therefrom a first delayed EOC signal;
   d. a second delay unit connected to the first delay unit and generating therefrom a second delayed EOC signal;
   e. a third delay unit connected to the second delay unit and responsive to the second delayed signal to generate therefrom a third delayed EOC signal;
   f. a latch connected to the analog-to-digital converter to receive therefrom the digital equivalent signal as an input and generating a latch output signal;
   g. an up-down counter connected to the latch and to the third time delay unit to receive a load signal from the third time delay unit and to receive as an input the latch output signal;
   h. a comparator connected to the up-down counter and the analog-to-digital converter and receiving a count signal from the up-down counter and a digital equivalent signal from the analog-to-digital converter for comparison;
   i. a first AND gate connected to the first time delay, the comparator, and the up-down counter and responsive to the signals from the first time delay and the comparator to provide an up-count as an output;
   j. a second AND gate connected to the comparator, the first time delay and the up-down counter and responsive to the signals from the first time delay and the comparator to produce a down count for input to the up-down counter;
   k. a first NAND gate connected to the second time delay unit and to the comparator to produce therefrom an increase signal;
   l. a second NAND gate connected to the comparator and to the second time delay unit to produce therefrom a decreasing signal;
   m. a third NAND gate connected to the first and second NAND gates and responsive to the outputs therefrom to produce a clock input to the latch;
   n. a flip-flop connected to the first and second NAND gates and receiving as a clear input the output of the first NAND gate, the flip-flop receiving as a pulse input the output of the second NAND gate, the flip-flop generating therefrom an output pulse, which output pulse changes in sign for each change from minimum to maximum of the minimax detector.

4. The apparatus of claim 2 wherein the display unit comprises a counter connected to the minimax unit and responsive thereto to count pulses therefrom, and a digital display unit connected to the counter to display the count of pulses obtained therein.

5. The apparatus of claim 2 wherein the display unit comprises a charge pump connected to the output of the minimax detector and responsive thereto to generate an electrical voltage that is proportional to the number of pulses received from the minimax detector; and an analog indicator connected to the charge pump to provide therefrom an analog display of the count of minima and maxima detected.

* * * * *